United States Patent [19]

Kitagawa et al.

[11] Patent Number: 5,187,116
[45] Date of Patent: Feb. 16, 1993

[54] PROCESS FOR PREPARING ELECTROLUMINESCENT DEVICE OF COMPOUND SEMICONDUCTOR

[75] Inventors: Masahiko Kitagawa; Yoshitaka Tomomura; Kenji Nakanishi, all of Nara, Japan

[73] Assignee: Sharp Kabushiki Kaisha, Osaka, Japan

[21] Appl. No.: 547,077

[22] Filed: Jul. 3, 1990

[30] Foreign Application Priority Data

Jul. 5, 1989 [JP] Japan .................................. 1-174417

[51] Int. Cl.$^5$ .................... H01L 21/363; H01L 21/443
[52] U.S. Cl. ..................................... 437/105; 437/127; 437/173; 437/185
[58] Field of Search ................. 148/DIG. 3, 4, 20, 21, 148/48, 64, 72, 86, 94, 99, 169, 33, 33.1, 33.4; 156/610-614; 427/53.1, 9; 357/16, 17; 437/61, 51, 54, 78, 79, 81, 105, 107, 126, 127, 173, 184, 185, 247, 904, 905, 915, 936, 963

[56] References Cited

U.S. PATENT DOCUMENTS

| | | | |
|---|---|---|---|
| 4,439,910 | 4/1984 | Vasudev | 437/905 |
| 4,477,311 | 10/1984 | Mimura et al. | 437/105 |
| 4,693,207 | 9/1987 | Hayakawa et al. | 118/715 |
| 4,786,616 | 11/1988 | Awal et al. | 437/105 |
| 4,843,031 | 6/1989 | Ban et al. | 437/129 |

FOREIGN PATENT DOCUMENTS

| | | | |
|---|---|---|---|
| 3124456 | 4/1982 | Fed. Rep. of Germany | 437/905 |
| 0091688 | 5/1983 | Japan | 437/127 |
| 0218180 | 12/1983 | Japan | 437/905 |
| 2204731 | 11/1988 | United Kingdom | 437/105 |

OTHER PUBLICATIONS

Bicknell et al., "P-Type CdTe Epilayers Grown by Photoassisted Molecular Beam Epitaxy", Appl. Phys. Lett., 49(25), Dec. 22, 1986, pp. 1735-1737.
Giles et al., ". . . II-VI Films . . . Grown by Photoassisted Molecular Beam Epitaxy", J. Crys. Growth, 86 (1988), pp. 348-353.
Elsner et al., "Pulsed-Laser-Assisted Molecular Beam Epitaxy", IBM TDB, vol. 26, No. 11, Apr. 1984, pp. 6215-6216.
Myers et al., "Properties of HgCdTe . . . Grown by Photoassisted Molecular Beam Epitaxy", J. Vac. Sci. Technol. A 7(2), Mar./Apr. 1989, pp. 300-304.
"Fundamental issues in heteroepitaxy—A Department of Energy, Council on Materials Science Panel Report"—J. Mater. Res. vol. 5, No. 4, Apr. 1990—pp. 852-894.
"Growth Rate Enhancement by Xenon Lamp Irradiation in Organometallic Vapor-Phase Epitaxy of ZnSe'"—Japanese Journal of Applied Physics vol. 26, No. 12, Dec. 1987, pp. L2000-L2002.
"Gas-Phase and Surface Reactions in Xenon Lamp-Assisted Organometallic Vapor-Phase Epitaxy of ZnSe'"—Japanese Journal of Applied Physics vol. 27, No. 11, Nov. 1988, pp. L2019-L2021.

*Primary Examiner*—Olik Chaudhuri
*Assistant Examiner*—R. Paladugu
*Attorney, Agent, or Firm*—Nixon & Vanderhye

[57] ABSTRACT

A process for preparing an electroluminescent device of a compound semiconductor comprising a step (A) of epitaxially forming over a semiconductor substrate an electroconductive layer of a compound semiconductor and an electroluminescent layer of a p-n junction type compound semiconductor placed over the electroconductive layer and a step (B) of forming a pair of ohmic electrodes as electrically connected to each of said layers, both of the steps (A) and (B) being performed by using molecular beam growth under the irradiation with a light beam.

8 Claims, 7 Drawing Sheets

Irradiated growth

Non-irradiated growth

Fig. I (a)
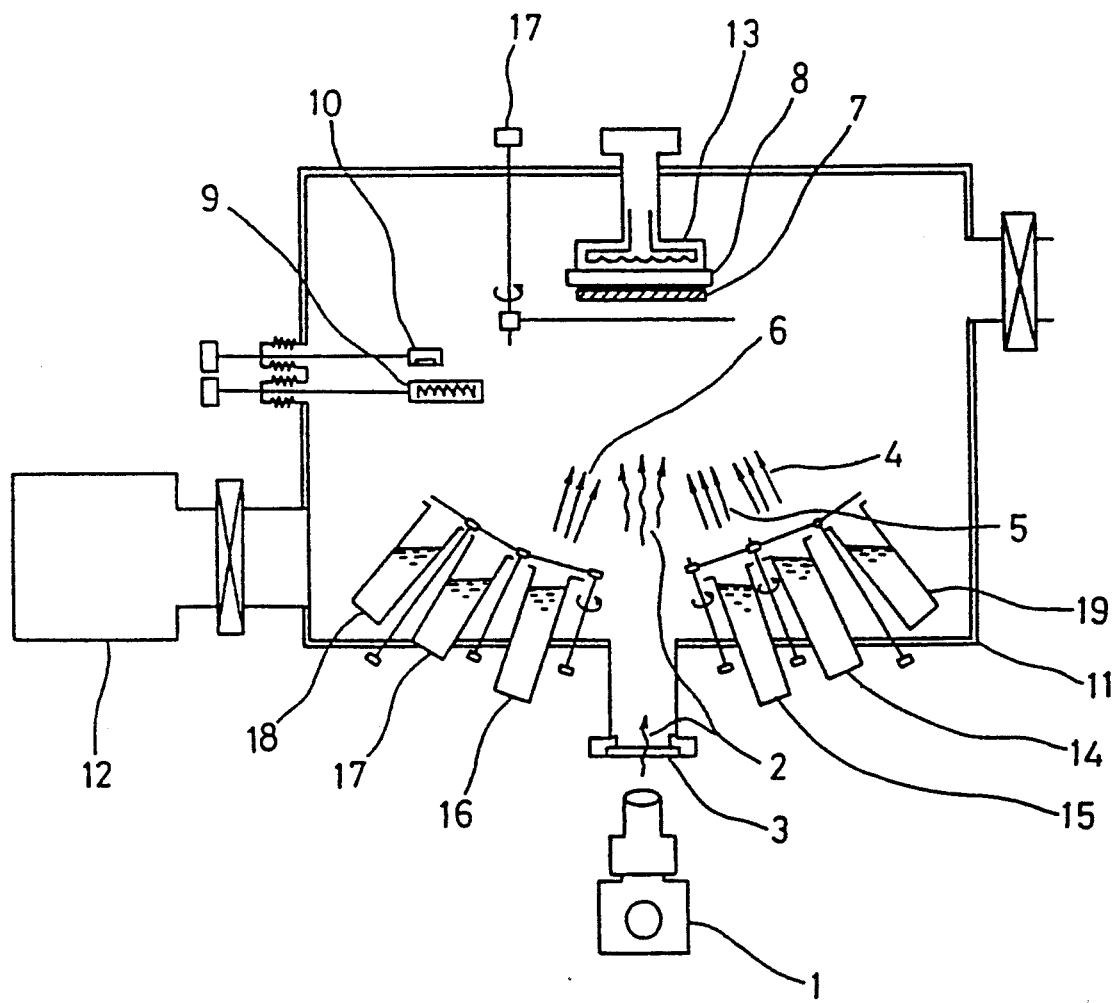

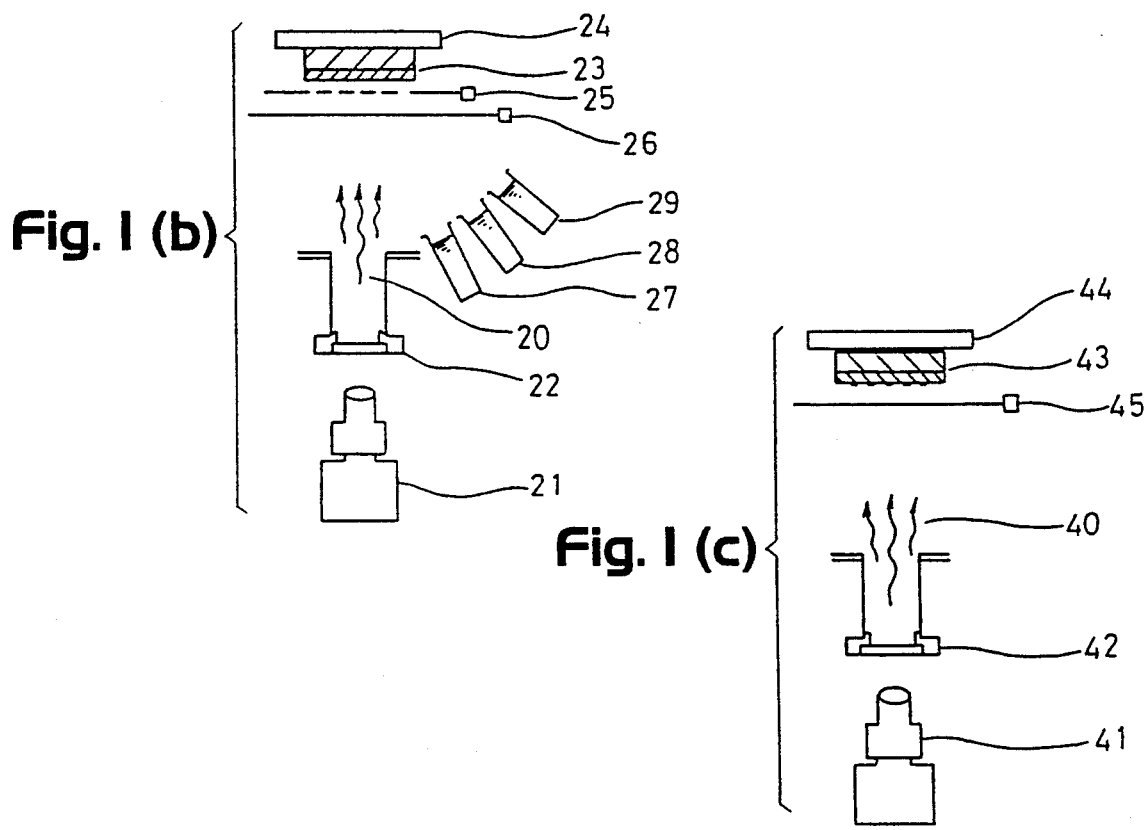
Fig. I (b)
Fig. I (c)
Fig. I (d)
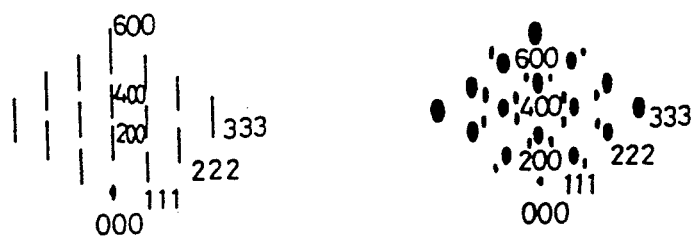
Irradiated growth        Non-irradiated growth

Fig. I (f)
Irradiated formation
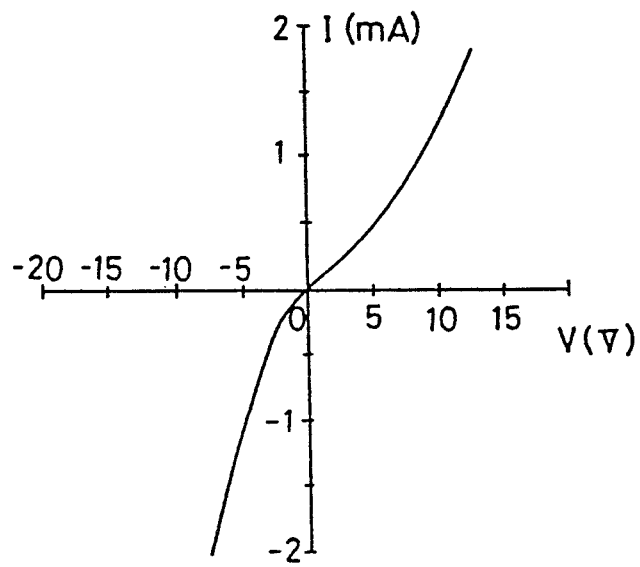
Fig. I (ff)
Non-irradiated formation
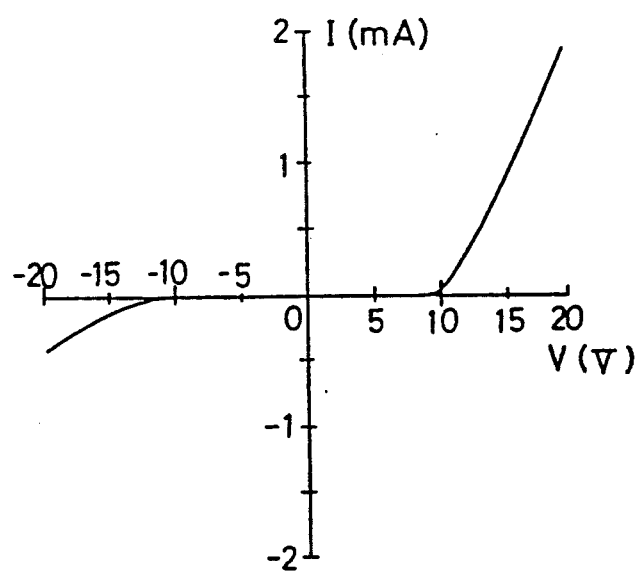

PROCESS FOR PREPARING ELECTROLUMINESCENT DEVICE OF COMPOUND SEMICONDUCTOR

BACKGROUND OF THE INVENTION

1. Field of the Invention

The present invention relates to a process for preparing an electroluminescent device of a compound semiconductor and, more particularly, to a process for preparing an electroluminescent device of a compound semiconductor by molecular beam epitaxial growth.

2. Description of the Prior Art

In preparing electroluminescent devices of compound semiconductors, molecular beam epitaxial growing method (MBE method) of excellent film thickness controllability and mass production efficiency is used for epitaxial crystal growth of a ZnS compound semiconductor on a single crystal semiconductor substrate, followed by formation of an electrode. For the crystal growth of ZnS by the MBE method, a single element of Zn and a single element of S or sulfur hydride ($H_2S$) are heated in Knudsen cells independently of each other and respective molecular (atomic) beams are supplied on a fully heated single crystal semiconductor substrate to effect crystal growth. Further, the electrode is formed by depositing an electrode material on the epitaxially grown ZnS film, placing them on a heated specimen table and applying a heat treatment.

Layers of multi-layer epitaxial growth crystals for semiconductor electroluminescent devices are doped with impurities for controlling the conduction type and luminescence color thereof. For example, the impurity elements usable herein include when ZnS is to be made as n-type, aluminum (Al), gallium (Ga), indium (In), group VII elements such as iodine (I), bromine (Br), chlorine (Cl) and fluorine (F) and, when it is to be made as p-type, group I elements such as lithium (Li), sodium (Na) and potassium (K), and group V elements such as nitrogen (N), phosphorus (P), arsenic (As) and antimony (Sb). When it is to be made semi-insulating, dopants are not added, or group IV element such as silicon (Si) or germanium (Ge) and a combination of one of the above-mentioned groups III and VII elements and one of the above-mentioned groups I and V elements are used. Another doping is often conducted, particularly, for providing luminescent centers and, in this instance, manganese (Mn) and Lanthanoids (rare-earth elements) including lanthanum (La), cerium (Ce), praseodymium (Pr), promethium (Pm),, samarium (Sm), europium (Eu), gadolinium (Gd), terbium (Tb), dysprosium (Dy), holmium (Ho), erbium (Er), thulium (Tm), ytterbium (Yb) and lutenium (Lu) can be used as impurities.

An epitaxial film according to the MBE method is formed by irradiating a substrate heated to a suitable temperature with a molecular beam or with such a beam as heated to a high temperature and also by irradiating with a molecular beam for doping elements at the same time.

Further, as a steps from the deposition of the electrode material for forming an electroluminescent device to the heat treatment, In-Hg alloy material is usually deposited on a ZnS epitaxial layer and, subsequently, an electrode (ohmic contact) is developed by heating to 350° C.–450° C. in an atmosphere such as $H_2$—Ar gas mixture (refer to: "Growth of ZnS Bulk Single Crystal and Homoepitaxial Growth of ZnS by Molecular Beam Epitaxy", "Extended Abstracts of the 19th Conference on Solid State Devices and Materials", Tokyo, 1987, pp. 247–250; "SINGLE CRYSTAL GROWTH OF ZnS BY THE METHOD OF GAS SOURCE MBE," Journal of Crystal Growth, 76(1987)440–448, North-Holland, Amsterdam; "Fundamental Issues in Heteroepitaxy" J. Mater. Res., Vol. 5, No. 4, pp. 852–894, Apr 1990).

However, many of starting elemental materials including the impurity elements described above (molecular beam materials, e.g., zinc, sulfur, selenium, tellurium, nitrogen, phosphorus, arsenic, iodine, bromine, chlorine and fluorine) have high vapor pressure and low adhesiveness on the substrate which is heated to a suitable temperature required for the growth of compound semiconductors (at least 300° C.), and therefore, it is impossible to grow high-quality single crystals of the compound semiconductors.

On the other hand, if compound semiconductors are grown at a high temperature which permitting the growth of high-quality crystals of each of the constituent compounds, they will develop point defects such as vacancies leading to deep levels or complex defects and become contaminated with objectionable impurities, thus resulting in serious drawbacks in respect of the characteristics of the compound semiconductors and it is, accordingly, desired to grow them at the lowest possible temperature.

However, of the impurity elements or constituent elements of semiconductors, the metal elements (Zinc, cadmium, aluminum, gallium, indium, sodium, potassium, silicon, germanium, manganese and all the lanthanoid elements) are present in the form of monoatomic molecules, whereas they are liable to aggregate on a substrate at low temperature to form solids without forming a compound or without diffusing as impurity elements. Further, the non-metallic elements are present usually in the form of diatomic molecules (tellurium, nitrogen, iodine, bromine and fluorine), tetraatomic molecules (arsenic and phosphorus) or polyatomic molecules containing two to eight atoms (sulfur and selenium). Accordingly, during the growth on the substrate at low temperature, decomposition and incorporation of them into the crystals fail to proceed smoothly, causing structural defects (minute twin crystals, crystal grain boundary of small tilt angle, minute island-like growths, etc.), making it extremely difficult to grow single crystals at high-quality and with controlled doping usable for the fabrication of semiconductor devices. Accordingly, the semiconductor multi-layer epitaxial crystals prepared by the conventional growing method, even when doped with impurity elements in a controlled fashion, become degraded when heated to a temperature not lower than the growth temperature. For example, it is not exceptional that a low-resistivity semiconductor epitaxial film fully doped with impurities increases in its resistivity by at least 10 orders of magnitude when treated by heating. Further, because they increase the resistivity when heated again up to the vicinity of the growth temperature, formation of the electrode involves a problem that additional ingenuity must be exercised in forming the electrode layer to avoid such a heat treatment. There is another problem of remarkable deterioration of the electroluminescent device after driving.

Incidentally, although MOCVD as conducted under the irradiation with light is known (Sg. Fujita, A. Tanabe, T. Sakamoto, M. Isemura and Sz. Fujita, Jpn. J.

Appl. Phys., 26 (1987) L2000; Sz. Fujita, E. Y. Takeuchi and Sg. Fujita, Jpn. J. Appl. Phys. 27 (1988) L2019), application of light for MBE is not known.

SUMMARY OF THE INVENTION

The present invention intends to overcome such technical problems in the prior art and the object thereof is to provide a process for preparing an electroluminescent device of a compound semiconductor capable of drastically reducing crystal defects in a low temperature growth by applying molecular beam materials containing an impurity element for doping onto a surface of a semiconductor substrate at a low temperature, thereby controlling the doping of impurities effectively.

According to the present invention, there is provided a process for preparing an electroluminescent device of a compound semiconductor comprising a step (A) of epitaxially forming over a semiconductor substrate an electroconductive layer of a compound semiconductor and an electroluminescent layer of a p-n junction type compound semiconductor placed over the electroconductive layer and a step (B) of forming a pair of ohmic electrodes as electrically connected to each of said layers, the electroconductive layer and the electroluminescent layer each being formed by applying, over the semiconductor substrate of a predetermined temperature, molecular (or atomic) beams for constituting a compound semiconductor and for doping the compound semiconductor with an impurity element, under the irradiation of the semiconductor substrate with a light beam and the pair of ohmic electrodes each being formed by applying a molecular (or atomic) beam of a metal over the electroconductive layer or the electroluminescent layer under the irradiation with a light beam.

DETAILED DESCRIPTION OF THE PREFERRED EMBODIMENTS

Figure 1:
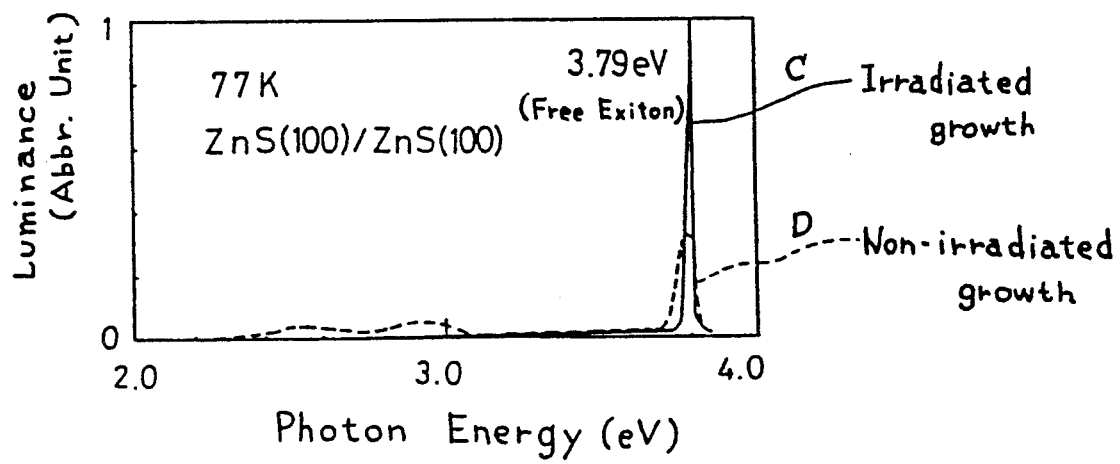
FIG. 1(a) is a view illustrating a thin film growing step by the application of a light beam on a semiconductor substrate used in one embodiment according to the present invention.
FIG. 1(b) is a view illustrating a step of forming an electrode on a semiconductor thin film under irradiation with a light beam.
FIG. 1(c) is a view illustrating a step of heating the semiconductor thin film by a light beam.
FIGS. 1(d) and (e) are, respectively, views for reflection electron beam diffraction (RHEED) image and a photoluminescent (PL) spectrum of the ZnS homoepitaxial film (A) grown under the irradiation with a light beam and ZnS homoepitaxial film grown under the irradiation with a light beam.
FIG. 1(f) is a view illustrating the current-voltage characteristics (C) of an electrode formed under the irradiation with a light beam and FIG. 1(ff) is a view illustrating the current-voltage characteristics (D) of an electrode formed without irradiation with a light beam.
FIGS. 1(g) and (h) are, respectively, views illustrating the change of resistivity before and after applying heat treatment to ZnS epitaxial film containing the growth region under the irradiation with a light beam and a growth region without irradiation with a light beam.
Figure 1:
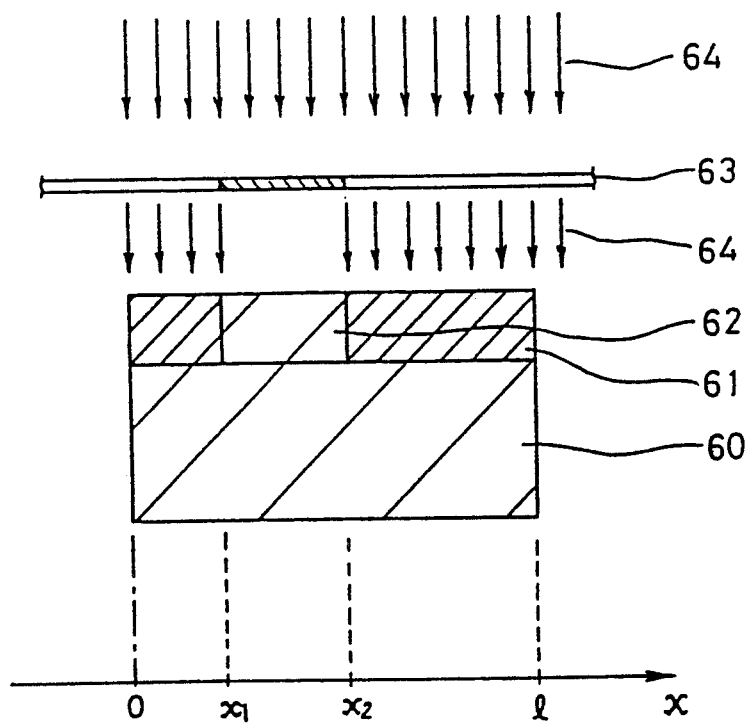
Figure 1:
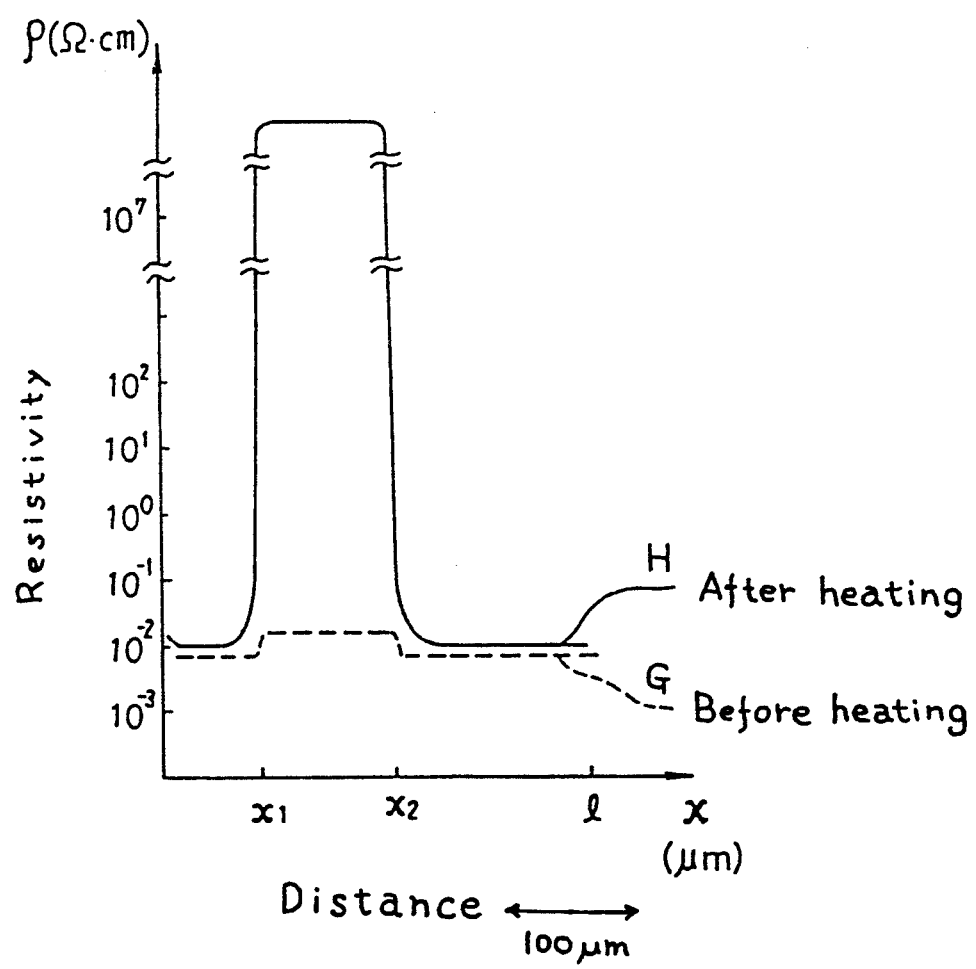

In the present invention, molecular (or atomic) beams for constituting a compound semiconductor and for doping the compound semiconductor with an impurity are applied over a semiconductor substrate heated to a predetermined temperature while irradiating with a light beam, thereby forming an electroconductive layer of a compound semiconductor or an electroluminescent layer of a p-n junction type compound semiconductor (step A).

The semiconductor substrate is used for epitaxially forming the conductive layer and the luminescent layer thereover. Single crystal semiconductor substrates are preferred and there can be used, for example, groups II-VI compound semiconductor substrates such as of ZnS, ZnSe, CdTe, CdHgTe, etc., group III-V compound semiconductor substrates such as GaP substrate, InP substrate and GaAsP substrate, as well as Ge substrate, etc. Among them, group II-VI compound semiconductor substrate such as of ZnS is particularly preferred. The semiconductor substrate is usually used being heated to 300° C. or below, preferably from 150° to 300° C. A temperature out of the range is not preferred since crystal defects are developed in the electroluminescent epitaxial film of the compound semiconductor formed thereon.

The source materials for the molecular beams employed in this invention, there can be mentioned, for example, in the case of the II-VI group compound semiconductor, at least two elements of the combination of a group II element (Zn, Cd, Hg or Mg) and a group VI element (S, Se or Te), and an impurity material such as a group I element (Li, Na, K, Cu, Ag or Au), a group V element (N, P, As or Sb), a group III element (In, Al, Ga or Tl), a group VII element (F, Cl, Br or I), a group IV element (Si, Ge or Sn), a transition metal element (Cr, Fe, Ni or Mn) or a rare-earth element (La, Ce, Pr, Nd, Pm, Sm, Eu, Gd, Tb, Dy, Ho, Er, Tm, Yb or Lu), etc; in the case of group III-V compound semiconductor at least, two elements of the combination of a group III element (In, Al or Ga) and a group V element (N, P, As or Sb), and am impurity material such as a group II element (Zn, Cd, Hg, Mg, Be or Mn), a group IV element (Si, Ge or Sn), a group VI element (S, Se or Te), a transition metal element (Cr, Fe, N, V or Tl), etc; in the case of using group IV element (C, Si or Ge) or a compound of such elements in combination as the matrix material, a group III, V or VII element or a transition metal element as an impurity element; in the case of using chalcopyrite compound as the matrix material, a combination of group I, III and VI elements and a group II, IV, V or VII element as an impurity element.

As the material for the molecular (atomic) beams in the present invention, a hydride or a methylated or ethylated organic metal compound of the above element can also be used in addition to or in place of the single element as described above. A combination of a group II element such as Zn or Cd and a group VI element such as S or Se is preferred among them for the source materials. In the case of the group II-VI compound semiconductor, the impurity element is, preferably, Al, Ga, In, Cl, Br, I, Cu/Al, etc. for the n-type and K, Na, N, P, As, Ag, etc. for the p-type.

The beams of respective elemental molecules (or atoms) for constituting the electroluminescent compound semiconductor and for doping it with an impurity can be produced, for example, by heating each of the source materials in Knudsen cells each having an outlet opening in the direction to the substrate.

The light beam is used in the present invention for causing chemical changes such as photodecomposition, photophoresis, photocoupling and photodissociation and is capable of decomposing polyatomic molecule such as of sulfur, selenium or tellurium into monoatomic molecule and is also capable of forming highly crystalline electroluminescent compound semiconductors upon the reaction of the source materials. They can be used while properly selecting irradiation intensity and wavelength. As the light beam, an output light from xenon (Xe) lamp (1 kw-5 kw) can be spectralized for use. In addition, various lights at a wavelength (usually 185-2000 nm) capable of resonance and absorption with semiconductors can be used including, for example, those supplied from Mercury (Hg) lamp (high- or low-voltage lamp), iodine (I) lamp, carbon (C) electrode lamp, excimer laser (ArF, KrF, XeF, XeCl, KrCl, ArCl or F), argon (Ar) ion laser, helium (He)-cadmium (Cd) metal vapor laser, helium (He)-zinc (Zn) metal vapor laser, nitrogen ($N_2$) laser, YAG laser and semiconductor laser, as well as secondary harmonic laser beams produced by these lasers and synchrotron radiation beam.

The electroconductive layer of a compound semiconductor functions as a base layer for epitaxially growing thereover the electroluminescent layer of the p-n junction type compound semiconductor and for forming a positive or negative electrode for applying a voltage to the electroluminescent layer. As the electroconductive layer, an epitaxially grown ZnS or ZnCdS thin film containing impurity Al or Cu/Al is preferably used. The ZnS or ZnCdS thin film can be formed as being usually from 1 to 10 $\mu$m in thickness, from $1 \times 10^{10}$ to $5 \times 10^{19}$ cm$^{-3}$ in carrier concentration and $1 \times 10^{-1}$ to $1 \times 10^{-3}$ $\Omega$.cm in resistivity.

the electroluminescent layer of p-n junction type compound semiconductor is used for producing a luminescence upon the application of a voltage and it can be composed of a n-type compound semiconductor electroluminescent layer and a $\pi$(p)-type semiconductor injection layer to develop a p-n junction. As the n-type compound semiconductor electroluminescent layer, a ZnS or ZnCdS thin film containing, for example, impurity Al or Cu/Al can be epitaxially grown on the electroconductive layer to form a layer usually from 0.2 to 3 $\mu$m in thickness, from $1 \times 10^{16}$ to $5 \times 10^{18}$ cm$^3$ in carrier concentration, from 50 to 200 cm$^2$/V.sec of mobility and from $5 \times 10^{-3}$ to 20 $\Omega$.cm in resistivity. Further, as the $\pi$(p)-type compound semiconductor injection layer, a Zn or ZnCdS thin film containing, for example, impurity K or As, can be epitaxially grown on the n-type compound semiconductor electroluminescent layer to obtain a layer usually from 0.05 to 10 $\mu$m in thickness, from $1 \times 10^{13}$ to $5 \times 10^{17}$ cm$^3$ in carrier concentration, from 5 to 100 cm$^2$/V.sec in mobility and $1 \times 10^4$ to $1 \times 10^3$ $\Omega$.cm in resistivity.

In the present invention, a pair of ohmic electrodes is formed by applying a molecular beam of a metal capable of forming the ohmic electrode over the conductive layer and the electroluminescent layer while irradiating with a light beam (step B).

The light beam is used for developing the ohmic electrode by activating the respective surfaces of the electroconductive layer and the electroluminescent layer to react them with the metal supplied as the molecular beam. The light beam at a wavelength, for example, from 1500 A to 1 $\mu$m can be applied onto the respective surfaces of the electroconductive layer and the electroluminescent layer thereby rendering the surface of the conductive layer and the electroluminescent layer reactive while the molecular beam of the metal is applied to form the ohmic electrode. Usable metals are those capable of providing an ohmic electrode on each of the electroconductive layer and the luminescent layer, such as In, Au, Al, Mg, Cd and Ni or an alloy thereof.

According to the present invention, there is further provided a process for preparing an electroluminescent device of a compound semiconductor, in which the irradiation of the semiconductor substrate with the light beam in the step (A) is effected through a masking member having a predetermined pattern for developing an irradiated area and a non-irradiated area over the substrate, and the electroconductive layer and the electroluminescent layer thus formed are further irradiated with a light beam so as to convert the portions of the electroconductive layer and the electroconductive layer under the non-irradiated area to highly resistant layers.

The masking member is used for developing the predetermined irradiation area and non-irradiation area in the step (A) of forming the electroconductive layer and the luminescent layer. As the masking member, the member of having a light transmitting portion in a predetermined pattern provided that the other portion being non-transmissible can be used as disposed between the light source and the substrate.

In the foregoing embodiment, a light beam is applied to the thus formed electroconductive layer and the electroluminescent layer.

The light beam are used for converting the electroconductive layer and the electroluminescent layer under the non-irradiated area into the highly resistant compound semiconductor layers. Various light beams capable of heating the conductive layer and the electroluminescent layer under the non-irradiated area to a temperature higher than the hysteresis temperature thereof (usually, the temperature for the semiconductor substrate during epitaxial growth) can be used. For example, the light beam at a wavelength of 500 nm to 1.2 $\mu$m are applied to instantaneously heat only the electroconductive layer and the electroluminescent layer locally to a temperature to 250° to 750° C., by which the electroconductive layer and the electroluminescent layer under the non-irradiated area can be converted by the diffusion of impurities therein into highly resistant compound semiconductor layers usually from $1 \times 10^3$ to $1 \times 10^{15}$ $\Omega$.cm. In the irradiated area a low resistivity usually of $2 \times 10^{-3} - 10$ $\Omega$.cm can be maintained even if the light beam is applied.

According to the present invention, there is also provided a process for preparing a electroluminescent device of a compound semiconductor in which the step (A) is repeated each through a step (C) of forming, without applying a light beam, a low resistant compound semiconductor layer over the electroluminescent layer formed in the previous step (A) to obtain an electroluminescent body of a plurality of the electroluminescent layers, which is subjected to a heat treatment for diffusing impurities of the low resistant compound semiconductor layer to convert into a highly resistant compound semiconductor layer.

The low resistant compound semiconductor layer is converted by the heat treatment into highly resistant compound semiconductor layer which functions as a insulating layer for isolating each of the electroluminescent layers. For instance, the low resistant compound semiconductor can be formed by epitaxially growing Zn or ZnCdS while being incorporated with impurities such as Al under non-irradiation with a light beam over the electroluminescent layer, thereby providing a layer usually from 0.05 to 10 μm in thickness, from $1 \times 10^{-2}$ to $1 \times 10^2$ Ω.cm in resistivity. The low resistant layer also functions as a base for the electroconductive layer in the next step (A). An electroconductive layer and an electroluminescent layer are again laminated on the low resistant compound semiconductor by the step (A) and, further, the low resistant compound semiconductor layer, conductive layer and electroluminescent layer can be laminated repeatedly and successively as required to integrally laminate a plurality of electroluminescent layers of p-n junction type compound semiconductor. The low resistant compound semiconductor layer can be converted by subjecting to a subsequent heat treatment into highly resistant compound semiconductor layer usually of from 1 to $10^3$ to $1 \times 10^{15}$ Ω.cm. The highly resistant compound semiconductor layers can insulate the plurality of the p-n junction type compound semiconductor electroluminescent layers from each other. The heat treatment is suitably applied at a temperature from 250° to 750° C. Although an electric furnace may be used, for instance, heat treatment by using the irradiation with a light beam is preferred since heating can be applied instantaneously and locally.

In the present invention, under the irradiation with the light beam, the source materials supplied as beams and capable of constituting an electroluminescent compound semiconductor and of doping them with an impurity absorb the light energy to cause chemical reactions such as photodecomposition, photophoresis and photocoupling, photodissociation and result in optical epitaxial growth. Since the efficiency of optical decomposition, phoresis, coupling and dissociation is dependent on the irradiation intensity and the wavelength of the light beam, atoms or molecules at the surface of a substrate given with energy by a properly selected light beam, particularly, the light beam selected so as to cause resonance and adsorption for the energy of the band gap and/or the localized level are not in the stationary state under heat energy, and single crystallization and impurity diffusion can be conducted efficiently even under such a low temperature that single crystals can not be grown without applying the light beam. Further, since metal elements deposited on the semiconductor layers under the irradiation with the light beam can also easily react with the surface provided with energy by the light beam in the same way, a pair of ohmic electrodes can efficiently be formed. Further, since heating by the irradiation with a light beam can be performed in a short time only for the epitaxial growth thin film, heating can be conducted with less circumstantial contamination or thermal hysteresis.

EXAMPLES

Example 1

As an example of the present invention, it will be described at first for the method of growing a homoepitaxial thin film of ZnS by the MBE method.

FIG. 1(a) is a explanatory view of an apparatus for growing crystals by MBE, in which the substrate surface of semiconductor crystals is irradiated with a light beam in perpendicular thereto. FIG. 1(b) is a schematic view for the apparatus used for a step of depositing electrode metal material under the irradiation with a light beam thereby forming an electrode. FIG. 1(c) is a schematic view of an apparatus and illustrating the step of applying instantaneous heating by the irradiation with a light beam.

With reference to FIG. 1(a), the interior of a super high vacuum container 11 made of stainless steel is evacuated to $10^{-10}$ torr by an ion pump 12. A ZnS single crystal substrate 7 having the orientation of (100) plane is placed on a substrate holder 8 made of molybdenum and heated to 250° C. by a heater 13. A molecular beam material 14 (Al source), molecular beam material 15 (Zn source) and molecular beam material 16 (S source) are supplied to the substrate 7 and, at the same time, the substrate 7 is irradiated with a light beam 2 at a wavelength of 350 nm (15 nm in half-value-width), emanating from a Xe lamp (1 kW) light source 1 and passing through an optical window 3.

In the drawings, 17, 18 and 19 represent beam sources for molecular beams of K, As and Cu respectively.

The pressure of the Al beam 4 is $1 \times 10^{-9}$ torr, the pressure of the ZnS beam 5 is $1 \times 10^{-6}$ torr and the pressure of the S beam 6 is $5 \times 10^{-8}$ torr. In this example, the light beam 2 was applied at a dose of about $2 \times 10^{-5}$ W/cm² and continuously applied over the entire period of growth. In the diagram, indicated at 9 is a beam control ion gauge, and at 10 a film thickness monitor.

FIG. 1(d) shows RHEED (reflection high energy electron diffraction) patterns of ZnS homoepitaxial single crystal films grown at a growing temperature of 250° C.; (A) for the crystals grown under the irradiation with the light beam 1, and (B) for the crystals grown without irradiation. FIG. 1(e) also shows PL (photoluminescence) spectra of the ZnS homoepitaxial films grown under the irradiation with the light beam (C) and grown without irradiation (D).

As can be seen from FIGS. 1(d) by (A) and (B), the epitaxial film formed without the irradiation with the light beam at 350 nm from the Xe lamp contains minute twin crystals over the entire film and is not in the form of single crystals owing to the low growth temperature. Much obscure diffraction points also indicate that the epitaxial crystal film is composed of minute mosaic crystals. In contrast, the crystal film formed under the irradiation with the light beam is in the form of a perfect single crystal film quite free from obscure diffraction points. Further as apparent from in FIG. 1(e) by (C) and (D), the crystal obtained under the irradiation with the light beam is three times as great as the crystal formed without irradiation (for the same film thickness of 0.5 mu) in the intensity of free excitron luminescence (3.79 eV) in the PL spectra and is small in half-width, thus revealing a remarkable effect of the light beam irradiation to form the single crystals.

The n-type ZnS homoepitaxial thin film doped with Al in this example shows a low resistance as $2\times10^{-3}$ Ω·cm in resistivity.

Further, for example, when the procedure of the present example described is repeated under the same growth conditions without application of the light beam, using an Al molecular beam at a pressure of $1\times10^{-9}$ torr, n-type ZnS epitaxial film is obtained having a carrier concentration of $2\times10^{18}$ cm$^{-3}$, mobility of 20 cm$^2$/V-sec and a low resistivity of $1\times10^{-1}$ ohm-cm. When the above Al-doping is conducted under the application of the light beam, an n-type ZnS epitaxial film of less resistivity can also be formed by setting the pressure of beams for the Al molecular beam material to $1\times10^{-9}$ torr under the same growing conditions. By irradiating with the light beam, the resulting grown crystals has 60 cm$^2$/V-sec in mobility and $6\times10^{18}$ cm$^{-3}$ in carrier concentration and has a reduced resistivity of 0.018 ohm-cm.

Accordingly, the light beam irradiation is effective for giving improved conductivity.

In FIG. 1(b), In emitted from an electrode material metal crucible, for example, crucible 27 is deposited to an epitaxial ZnS thin film 23 on a substrate heating holder 24 under super high vacuum, through an electrode pattern forming mask 25 and under the irradiation with a light beam 20 emanating from an optical source 21 and applied through an optical window 22. FIG. 1(f) shows current-voltage characteristics between the thus formed electrodes in comparison for the case of non-irradiation (F) and under light beam irradiation (E) as illustrated in FIG. 1(ff). The electrode under light beam irradiation shows ohmic property, whereas the electrode formed under-non-irradiation shows non-ohmic property and this illustrates a remarkable effect of the electrode forming step (B) in accordance with the present invention.

In FIG. 1(c), an epitaxial thin film 43 on a substrate holder 44 under super high vacuum is optically heated by a light beam 40 emanating from an optical source 41 and applied through an optical window 42. As the heating optical source 41, an Xe lamp, for example, at 500-1 kW is used without spectralization and, by condensing the light beam, a short time heating can be conducted with the temperature elevation period up to 500° C, for example, with in 10 sec and the cooling time within 20 sec. With such a step, electric characteristics of the low resistant n-type epitaxial XnS crystals doped with impurities are greatly changed between the light irradiation portion and non-light irradiation portion. FIGS. 1(g) and (h) show examples for illustrating this step.

In FIG. 1(g), indicated at 60 is a ZnS(100) single crystal substrate, at 61 a portion irradiated with light beam (350 nm, $2\times10^{-5}$ W/cm$^2$) of a Xe lamp, at 62 a non-irradiated portion, at 63 a light adjusting slit, at 64 a light beam from Xe lamp. The film having the portion 61 and 62 is grown at a zinc (Zn) beam pressure of $1\times10^{-6}$ torr, sulfur (S) beam pressure of $5\times10^{-6}$ torr, aluminum (Al) beam pressure of $3\times10^{-9}$ torr, and at a substrate temperature of 260° C. With respect to the electrical characteristics of the film, the portion 62 has $2\times10^{-2}$ ohm-cm in resistivity and $10^{18}$ cm$^{-3}$ in carrier concentration, and the portion 61 has $7\times10^{-3}$ ohm-cm in resistivity and $6\times10^{18}$ cm$^{-3}$ in carrier concentration. FIG. 1(h) shows resistivity of the epitaxial film shown in FIG. 1(g) after the film has been heated in a vacuum at 260° C. for 30 minutes. The irradiation-growth portion 61 has $1\times10^{-2}$ ohm-cm in resistivity, and the resistivity of this portion as grown remains substantially unchanged, whereas the resistivity of the non-irradiated portion 62 as grown increases at least by about $10^9$ times to a high resistivity of not lower than $10^7$ ohm-cm. since the non-irradiated portion 62 has not yet sufficiently crystallized, it is readily given with a high resistivity by the heat treatment. On the other hand, since the irradiated portion 61 has fully crystallized, it retains the characteristics of this portion as grown despite the heat treatment.

EXAMPLE 2

In the second example, description will be made for the example of forming an electroluminescent device by the formation of an impurity-doped epitaxial crystal layer under the irradiation with a light beam and a layer under non-irradiation of light and by isolation of characteristics after the heat treating step.

Figure 2:
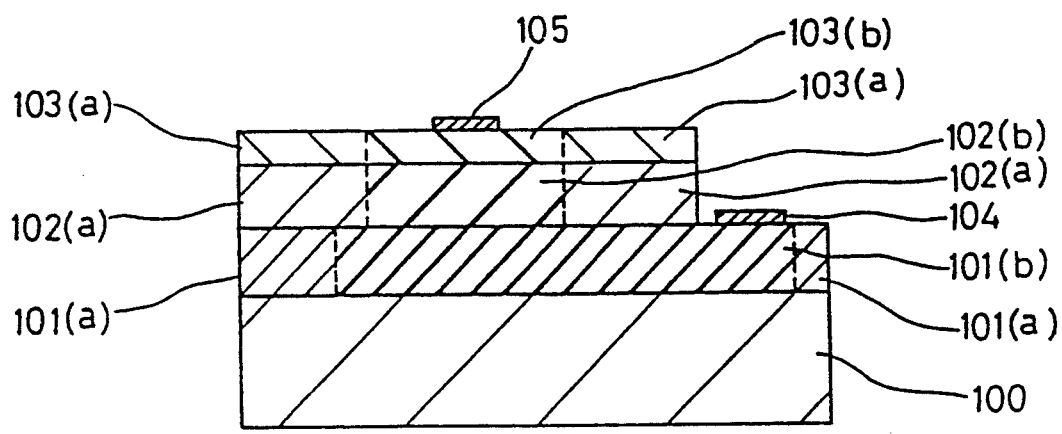
FIG. 2 is a view illustrating an electroluminescent device prepared by forming an epitaxial thin film while changing the irradiation area with a light beam on a semiconductor substrate wafer, displacing the position (changing the special position and the dimensional shape), to form an electrode under the irradiation with a light beam and then applying heating by the irradiation with a light beam.
Figure 2:
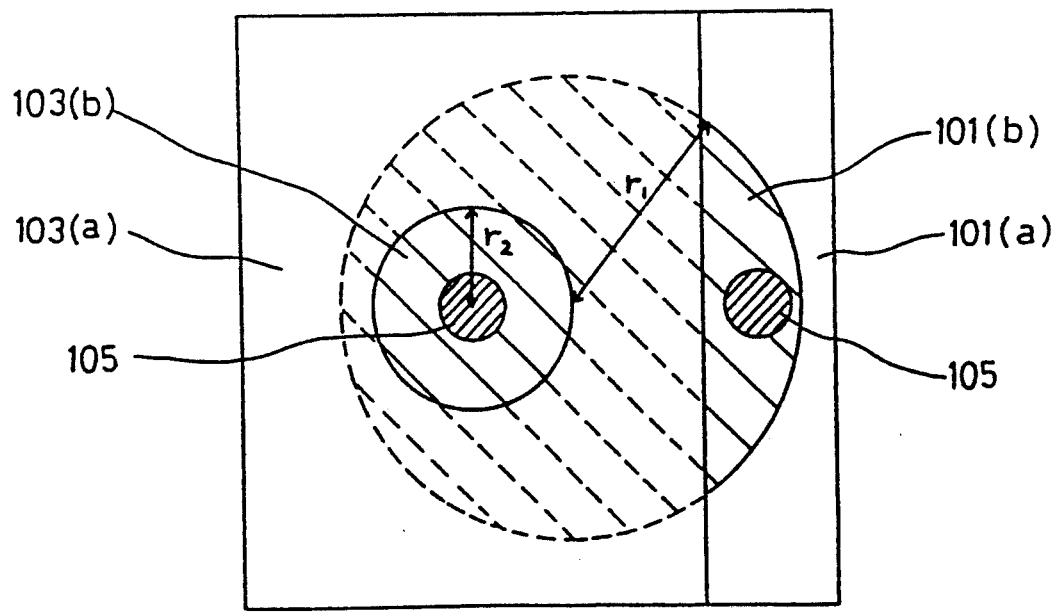

FIG. 2 shows an example of an electroluminescent device prepared by a method comprising a step of developing a light irradiated area and a non-irradiated area and a heat treatment step after the formation of the electrode under the irradiation with a light beam and formation of an epitaxial film. In FIG. 2, indicated at 100 is a ZnS(100) single crystal substrate, at 101(a), (b) an Al-doped low resistant n-type ZnS epitaxial conductive layer, in which 101(a) is a light non-irradiated area and 101(b) is a light irradiated area, at 102(a), (b) an Al-doped low resistant n-type ZnS epitaxial electroluminescent layer in which 102(a) is a light non-irradiated area and 102(b) is a light irradiated area, at 103(a), (b) a K-doped π-type ZnS epitaxial injection layer, in which 103(a) is a light non-irradiated area and 103(b) is a light irradiated area, at 104 a metal electrode In and at 105 a metal electrode Au. For forming the layers 101(a) and (b), layers 102(a) and (b) and layers 103(a) and (b), there are applied zinc (Zn) beam at a pressure of $1\times10^6$ torr, sulfur (S) beam at a pressure of $5\times10^{-6}$ torr, and Xe light beam (350 nm, half-width of 15 nm, optical intensity of $2\times10^5$ W/cm$^2$), and the impurity beams are applied as the doping impurities successively to the layers, that is, Al beam at a pressure of $3\times10^{-9}$ torr to the layer 101, Al at $5\times10^{-10}$ torr to the layer 102 and K at $2\times10^{-3}$ torr to the layer 103, respectively.

FIG. 2(b) shows a plan view showing the light irradiated portion corresponding to FIG. 2(a).

In the cross sectional structure shown in FIG. 2(a), a light beam through a first slit of diameter r$_1$ is irradiated upon growing the layer 101 to form an irradiated portion 101(b) at a portion in the wafer. Upon subsequent forming of the layers 102 and 103, a light irradiation area is formed by passing the light beam through another second slit of diameter r$_2$ (about: $r_2<0.5$ r$_1$).

In the thus formed electroluminescent device structure, change of characteristics, that is, stabilization like that shown in FIGS. 1(g), (h) are attained by applying a heat treatment at a temperature of higher than 260° C. Each of the portions 101(a), 102(a), 103(a) is rendered highly resistant after the heat treatment, enabling to form a structure in which the current path is restricted to the less resistive portions 101(b), 102(b), 103(b). The electrode forming step is the same as in the example shown in FIG. 1(b), (f).

This examples shows that the preparation method comprising the light irradiation step, electrode forming step and heat treatment step in accordance with the present invention is extremely effective for the formation of a practical device.

EXAMPLE 3

The third examples shows one example of a method of integrally preparing a plurality of electroluminescent layers.

Figure 3:
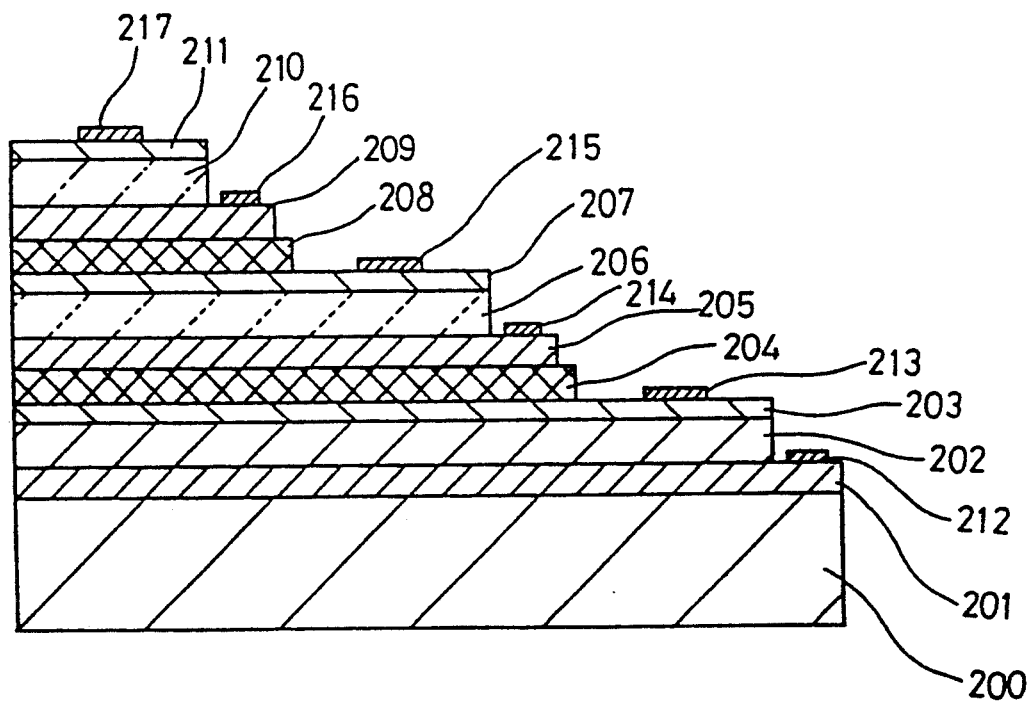
FIG. 3 is a view illustrating an example of an isolation type multi-electroluminescent device prepared by the process of the invention.

In FIG. 3, indicated at 200 is a ZnS(100) single crystal substrate having a band gap of 3.7 eV (335 nm) and transparent within a range from a visible region to a near UV-region. Upon forming the ZnS layer, beam pressure is set at $1 \times 10^{-6}$ torr for zinc (Zn) beam and at $5 \times 10^6$ torr for the sulfur (S) beam. Indicated at 201 is a ZnS: Al low resistant ($5 \times 10^{-3}$ cm) n-type electroconductive layer to which Al has been added at a beam pressure of $6 \times 10^{-9}$ torr and at 202 a layer to which Al has been added at a beam pressure of $5 \times 10^{-10}$ torr. ZnS:Al n-type low resistant ($10^{-1}$ Ω.cm) n-type electroluminescent layer 203 is a ZnS:As $\pi$(p)-type injection layer doped with As at a beam pressure of $1 \times 10^{-6}$ torr. Upon growing each of 201, 202 and 203, a light beam at a wavelength of 335 nm prepared by spectralizing a light from a Xe lamp (half-width value of 15 nm, intensity of $2 \times 10^{-6}$ W/cm$^2$) is applied. Indicated at 204 is a ZnS: Al layer grown under the application of Al at a beam pressure of $1 \times 10^{-9}$ torr without irradiating with a light beam. The layer 204 shows a resistivity of about 1 Ω.cm during growing and is rendered highly resistant (insulative) to the same extent as shown in FIG. 1(h) by way of heat treatment at a temperature higher than the growing temperature. Indicated at 205 is a ZnS:Al low resistant n-type conductive layer ($4 \times 10^{-3}$ cm) doped with Al at a beam pressure of $6 \times 10^{-9}$ torr under the irradiation with a light beam, at 206 is a ZnS:Cu, Al low resistant n-type luminescent layer ($1 \times 10^{-1}$ Ω.cm) doped with Cu at a beam pressure of $2 \times 10^{-10}$ torr, at 207 a ZnS:Al $\pi$(p)-type injection layer doped with As at a beam pressure of $1 \times 10^{-8}$ torr, 206 and 207 being formed both under light irradiation. Indicated at 208 is a ZnS:Al layer formed under the non-light irradiation and under the condition at an Al beam pressure of $1 \times 10^{-10}$ torr like that in 208 and 204. 201 and 211 are grown under the irradiation with a light beam in the same way as in two sets of epitaxial layers 201–203 and 205–207. Indicated at 209 is a ZnS:Al low resistant n-type conductive layer doped with Al at a beam pressure of $8 \times 10^{-8}$ torr, at 210 a low resistant n-type ZnCdS:Al luminescent layer (resistivity of $1 \times 10^{-1}$ Ω.cm) doped with Al at a beam pressure of $5 \times 10^{-10}$ torr and Cd at a beam pressure of $2 \times 10^7$ torr, at 211 a ZnS:As $\pi$-type injection layer doped with As at a beam pressure of $1 \times 10^{-8}$ torr. Indicated at 212, 214 and 216 are In electrodes formed under light irradiation and at 213, 215 and 217 Au electrodes formed in the same way. The multi-layer structural epitaxial film thus prepared is rendered highly resistant (insulative) in the epitaxial layers 204, 208 as the light non-irradiated portion by the heat treatment at 260° C. and electrical insulation is formed between two layers in contact with each of the layers. In such a device structure, the electroluminescent layers placed between electrodes 212 and 213, 214 and 215, 216 and 217 are isolated from each other, and multi color electroluminescent device is realized, which emits blue luminescence due to the junction between 202 and 203 (460 nm) green luminescence due to the junction between 206 and 207 (530 nm) and red luminescent due to the junction between 210 and 211 (680 nm). With the method of preparing the structure in this example, it is possible to form a device isolation structure extremely easily by interrupting the irradiation with a light beam only upon forming the layers 204 and 208.

In summary, the process for preparing an electorluminescent device of a compound semiconductor according to the present invention can enjoy the following advantageous effects:

1) It is possible to develop a single crystallization and effective doping with impurity as low temperature, and permit a preparation of crystals for electroluminescent device of a compound semiconductor with satisfactory controllability for electrical and optical properties and with good stability as well as a formation of ohmic electrodes with high efficiency.

2) It is possible to prepare an electroluminescent device of a semiconductor in which a portion of a specific electroconductivity is spatially designed into an optional shape in a semiconductor layer, by forming the semiconductor layer under partially irradiated with a light beam.

3) it is possible to prepare a semiconductor electroluminescent device in which a plurality of luminescent layers are electrically isolated by use of a step of forming a grown layer irradiated with a light beam and a grown layer not irradiated with such light beams and a step of forming an electrode under the irradiation with a light beam.

Further, the present invention can be applied to the electroluminescent device of a compound semiconductor as described above, as well as to photointegrated circuit devices, 3-dimensional circuit devices, identical group-different type junction devices and also to semiconductor functional devices comprising a combination of group IV/III-V hetero junction device, group III-V/II-VI hetero junction device, group IV/II-VI hetero junction device and group IV/III-V/II-IV hetero junction device, not restricted only to electroluminescent device such as light emitting diode, semiconductor laser, field effect electroluminescent device, etc.

What we claimed is:

1. A process for preparing an electroluminescent device of a compound semiconductor comprising a step (A) of epitaxially forming over a semiconductor substrate an electroconductive layer of a compound semiconductor and an electroluminescent layer of compound semiconductor which has a p-n junction, said electroluminescent layer being placed over the electroconductive layer and a step (B) of forming a pair of ohmic electrodes electrically connected to each of said layers, the electroconductive layer and the electroluminescent layer each being formed by applying, over the semiconductor substrate heated to a predetermined temperature range, molecular or atomic beams for constituting a compound semiconductor and for doping the compound semiconductor with an impurity element, under the irradiation of the semiconductor substrate with a light beam and the pair of ohmic electrodes each being formed by applying a molecular or atomic beam of a metal over the electroconductive layer or the electroluminescent layer under the irradiation with a light beam.

2. The process of claim 1 in which the semiconductor substrate is a group II–VI compound semiconductor.

3. The process of claim 2 in which the predetermined temperature range is from 150° C. to 300° C.

4. The process of claim 1 in which the light beam has a wavelength in the range of about 185 to about 2000 nm.

5. The process of claim 1 in which the electroconductive layer are each compound of a II–VI element compound semiconductor, a III–V element compound semiconductor, a IV element compound semiconductor or a chalcopyrite compound semiconductor.

6. The process of claim 1 in which the ohmic electrodes are each made of a metal selected from the group consisting of In, Au, Al, Mg, Cd and Ni; or an alloy thereof.

7. A process for preparing an electroluminescent device of a compound semiconductor comprising a step (A) of epitaxially forming over a semiconductor substrate an electroconductive layer of a compound semiconductor and an electroluminescent layer of a compound semiconductor which has a p-n junction, said electroluminescent layer being placed over the electroconductive layer and a step (B) of forming a pair of ohmic electrodes electrically connected to each of said layers, the electroconductive layer and the electroluminescent layer each being formed by applying, over the semiconductor substrate heated to a predetermined temperature range, molecular or atomic beams for constituting a compound semiconductor and for doping the compound semiconductor with an impurity element, under the irradiation of the semiconductor substrate with a light beam, the pair of ohmic electrodes each being formed by applying a molecular or atomic beam of a metal over the electroconductive layer or the electroluminescent layer under the irradiation with a light beam, and the irradiation of the semiconductor substrate with the light beam in the step (A) is obtained by irradiating through a masking member having a predetermined pattern for developing an irradiated area and a non-irradiated area over the substrate, and the electroconductive layer and the electroluminescent layer thus formed are further irradiated with a light beam so as to convert the portions of the electroconductive layer and the electroconductive layer under the non-irradiated area to highly resistant layers.

8. A process for preparing an electroluminescent device of a compound semiconductor comprising a step (A) of epitaxially forming over a semiconductor substrate an electroconductive layer of a compound semiconductor and an electroluminescent layer of a compound semiconductor which has a p-n junction, said electroluminescent layer being placed over the electroconductive layer and a step (B) of forming a pair of ohmic electrodes electrically connected to each of said layers, the electroconductive layer and the electroluminescent layer each being formed by applying, over the semiconductor substrate heated to a predetermined temperature range, molecular or atomic beams for constituting a compound semiconductor and for doping the compound semiconductor with an impurity element, under the irradiation of the semiconductor substrate with a light beam, the pair of ohmic electrodes each being formed by applying a molecular or atomic beam of a metal over the electroconductive layer or the electroluminescent layer under the irradiation with a light beam, and the step (A) is repeated through a step (C) of forming, but without applying a light beam, a low resistant compound semiconductor layer over the electroluminescent layer formed in the previous step (A) to obtain an electroluminescent body of a plurality of the electroluminescent layers, which is subjected to a heat treatment for diffusing impurities of the low resistant compound semiconductor layer to convert into a highly resistant compound semiconductor layer.

* * * * *